United States Patent [19]

Endoh et al.

[11] 4,353,060
[45] Oct. 5, 1982

[54] ANALOG TO DIGITAL CONVERTER SYSTEM WITH AN OUTPUT STABILIZING CIRCUIT

[75] Inventors: Kenjiro Endoh; Yoshiyuki Ishizawa; Masanori Tanaka, all of Yokohama; Koji Iwasaki, Gotenba, all of Japan

[73] Assignee: Tokyo Shibaura Denki Kabushiki Kaisha, Kawasaki, Japan

[21] Appl. No.: 165,037

[22] Filed: Jul. 1, 1980

[30] Foreign Application Priority Data

Jul. 13, 1979 [JP] Japan .................................. 54-88769

[51] Int. Cl.³ .......................................... H03K 13/02
[52] U.S. Cl. ........................ 340/347 AD; 340/347 CC
[58] Field of Search ................. 340/347 AD, 347 CC; 333/14; 375/26, 28

[56] References Cited

U.S. PATENT DOCUMENTS

| | | | |
|---|---|---|---|
| 2,927,962 | 3/1960 | Cutler | 375/26 |
| 3,745,562 | 7/1973 | Rosenbaum | 340/347 AD |
| 3,793,513 | 2/1974 | Kaneko | 375/28 |
| 3,872,434 | 3/1975 | Duvall | 340/347 AD X |
| 4,107,669 | 8/1978 | Tewksbury | 340/347 AD |

Primary Examiner—Charles D. Miller
Attorney, Agent, or Firm—Oblon, Fisher, Spivak, McClelland & Maier

[57] ABSTRACT

The sum of an analog input signal and a positive feedback signal is applied to an A/D converter. A D/A converter device including a D/A converter and a delay device for delaying an analog feedback signal which is a signal formed by D/A converting the output of the A/D converter by one conversion operation period of the A/D converter. The positive feedback signal is formed by multiplying the analog feedback signal by a given feedback coefficient.

8 Claims, 25 Drawing Figures

ANALOG TO DIGITAL CONVERTER SYSTEM WITH AN OUTPUT STABILIZING CIRCUIT

The present invention relates to an analog to digital converter system and more particularly to an analog to digital converter system with an output stabilizing circuit.

The analog to digital (A/D) converter, which converts an analog signal into a digital signal corresponding to a level of the analog signal, finds extensive use.

Figure 1:
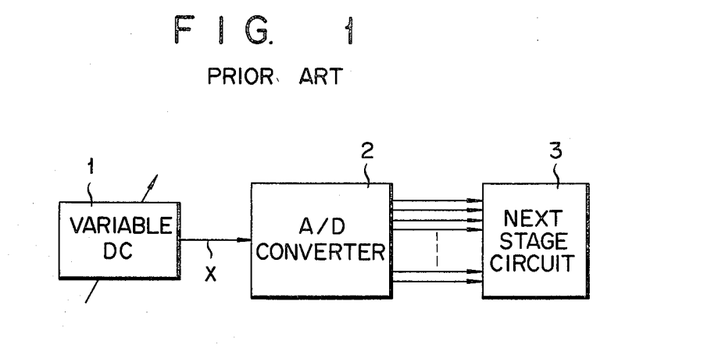
FIG. 1 is a block diagram of an application using a conventional A/D converter.
Figure 2:
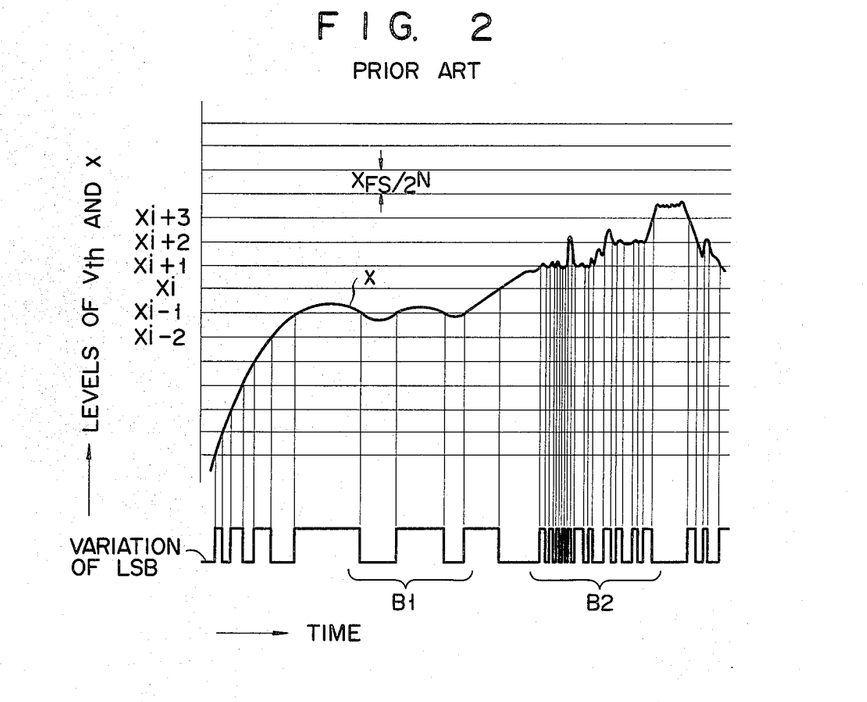
FIG. 2 is a graph useful in explaining the defects in the conversion characteristic of the converter shown in FIG. 1.

An application using a conventional A/D converter will be described in brief referring to FIG. 1. An analog input signal x derived from a variable DC voltage source 1 is converted into a digital signal by an A/D converter 2 and the converted one is applied to a circuit 3 of the next stage, for example, a digital data processor. In this case, when the signal level of the analog input signal x is approximate to one of the threshold ($V_{th}$) levels set in the A/D converter 2, if the level of the analog input signal or the $V_{th}$ levels vary due to temperature change and induction noise and the like, the digital output signal as derived from the A/D converter 2 varies. This causes an erroneous operation of the succeeding stage circuit 3. The variation of the output of a conventional A/D converter will be described referring to FIG. 2. Assume that a full scale of the analog input signal x to the A/D converter 2 is $X_{FS}$ and the number of bits of the digital output signal is N. Set in the A/D converter 2 is the $V_{th}$ levels ..., $X_{i-1}$, $X_i$, $X_{i+1}$, $X_{i+2}$, ... of ($2^N-1$) with intervals $\Delta X = X_{FS}/2^N$, as illustrated by the ordinate of the graph shown in FIG. 2. The analog input signal x is compared in level with the $V_{th}$ levels and then is converted into a digital output signal. Assume now that the period (an inverse number of a sampling frequency of an analog input signal x) of a command pulse (not shown) applied to the A/D converter 2 is much shorter than that of a variation of the input signal x. On this assumption, the least significant bit (LSB) of the digital output signal is inverted, or changed, each time the analog input signal x crosses the $V_{th}$ level, as illustrated along the abscissa representing the lapse of time in FIG. 2. The inversion of the LSB also takes place when the A/D conversion is not performed in a binary conversion manner. In the LSB inversion, at least one bit of the N bits is inverted or changed. The bit inversion takes place when the input signal x varies with a long period as expressed by a range B1 and also when it varies with a short period as expressed by a range B2, due to noise. This indicates that the A/D converter operates instably.

Accordingly, an object of the present invention is to provide an A/D converter system which can stably produce a digital signal irrespective of a level variation of an analog input signal due to temperature change or noise, with an aid of an output stabilizing circuit operating in such a way that the succeeding A/D conversion is not performed (to produce the same output signal as that of the preceding A/D conversion) till after the A/D converter performs the A/D conversion at a first level of an analog input signal, the analog input signal changes from the first level to exceed a given level.

According to the present invention, there is provided an A/D converter system with an output stabilizing circuit comprising: an adder for summing an analog input signal and a positive feedback signal; an A/D converter for converting the output signal from the adder into a digital signal; a D/A converter means for producing an analog feedback signal corresponding to the output signal from the A/D converter after at least one converting operation period of the A/D converter, the D/A converter means including a D/A converter and a signal delay means; and a feedback coefficient multiplier for producing the positive feedback signal obtained by multiplying a given feedback coefficient by the analog feedback signal.

The present invention will be better understood when carefully reading the following description taken in connection with the accompanying drawings, in which.

Figure 3:
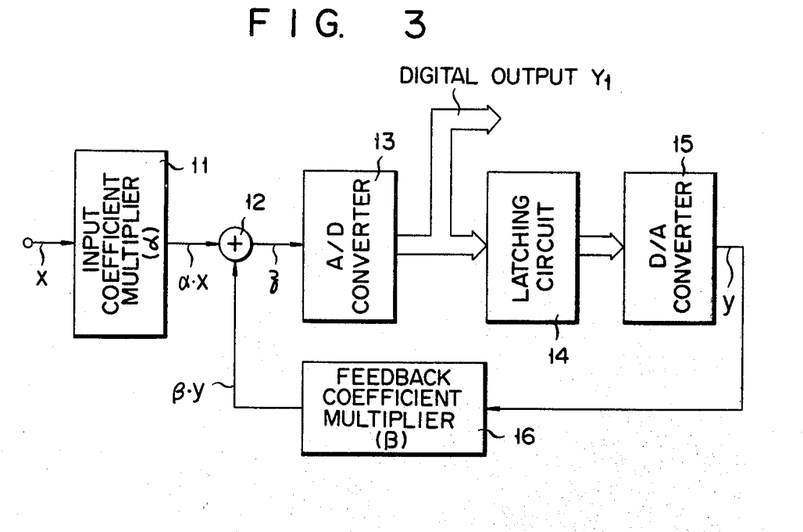
FIG. 3 is a block diagram of an A/D converter system according to a first embodiment of the invention.

Reference is first made to FIG. 3 illustrating an embodiment of the A/D converter system according to the invention. In the figure, an input analog signal x is applied to an input coefficient multiplier 11 where it is multiplied by an input coefficient $\alpha$. Following the multiplying operation, the multiplier 11 produces an analog signal $\alpha \cdot x$. An adder 12 sums the analog signal $\alpha \cdot x$ and a positive feedback signal $\beta \cdot y$ and applies the summed signal z to an A/D converter 13. The A/D converter 13 converts the summed signal z into a digital signal $Y_1$ of N bits, for example. The digital signal $Y_1$ is led as a digital converted signal of the analog input signal x to a given circuit (not shown) and to a latching circuit 14 as well. The latching circuit 14 holds the digital signal $Y_1$ from the A/D converter 13 during a period of at least one converting operation of the A/D converter 13 which corresponds to a period from a first command pulse to a time point between the first command pulse and a second command pulse next to the first command pulse. Each time that the A/D converter 13 responds to the second command pulse to update the digital output signal $Y_1$, the latching circuit 14 stores the updated digital output signal. In other words, the latching circuit 14 holds the digital output signal previously latched after it latches the digital output signal from the A/D converter 13 till the A/D converter 13 produces a new digital signal in the next converting operation. The digital output signal held by the latching circuit 14 is led to the D/A converter 15 and is converted into an analog signal y. In connection with the D/A converter 15, the latching circuit 14 may be replaced by a delay means for delaying the output signal y from the D/A converter 15 disposed between the D/A converter 15 and the adder 12. The analog signal y from the D/A converter 15 is led to a feedback coefficient multiplier 16 where it is multiplied by a given feedback coefficient $\beta$ ($0 < \beta < 1$). The multiplied one is applied as a positive feedback signal $\beta \cdot y$ to the adder 12. The latching circuit 14, the D/A converter 15, the feedback coefficient multiplier 16 and the adder 12 cooperate to constitute a positive feedback loop for stabilizing the output signal $Y_1$ of the A/D converter 13.

Accordingly, the A/D converter 13 converts the analog input signal z given by $z = \alpha \cdot x + \beta \cdot y$ into a corresponding digital signal.

Figure 4:
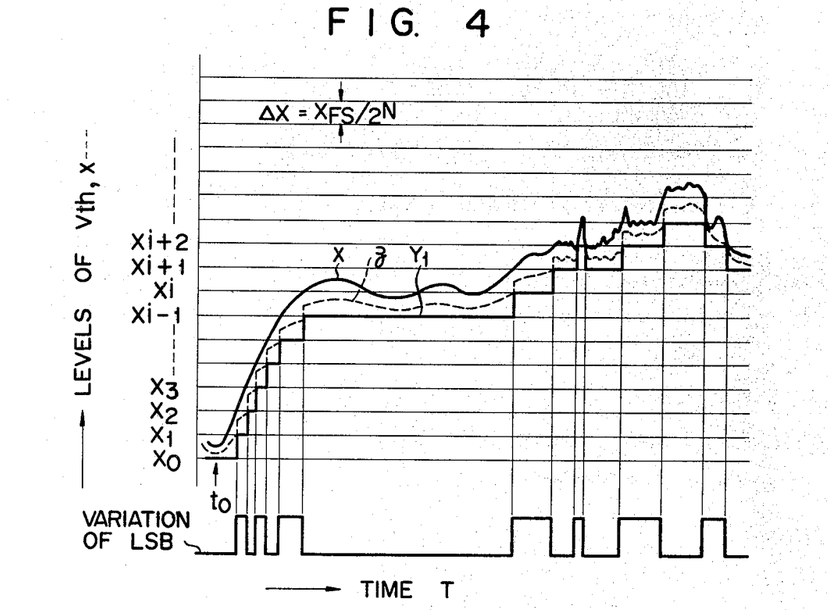
FIGS. 4 to 7 are waveforms useful in explaining the operation of the circuit shown in FIG. 3.

A minimum quantitizing accuracy (the width of the converting step) of the A/D converter 13 denoted as $\Delta X$ is given by $$\Delta X = X_{FS}/2^N$$

where $X_{FS}$ is a full scale of the A/D converter 13 and N is the number of bits of the digital output signal $Y_1$. As shown in FIG. 4, the level $X_i$ ($i=0, 1, 2, 3, \ldots, 2^N$) of the digital converting output signal is related to the level of the analog signal z as follows:

$$X_i \leq z < X_{i+1} = X_i + \Delta X$$

Specifically, when the level of the analog signal z is between $X_i$ and $X_{i+1}$, the A/D converter 13 produces a digital converting signal corresponding to the level $X_i$. The above-mentioned output stabilizing circuit acts on the A/D converter 13 in the following manner. In the explanation of the operation, it is assumed that the input coefficient $\alpha$ and the feedback coefficient $\beta$ are each selected to be 0.5.

As shown in FIG. 4, the analog signal x changes with time and the A/D converter 13 performs the converting operation at a much higher speed than a rate of change of the analog input signal x. It is further assumed that the level of the analog input signal x is in a range defined by $X_o < x < X_1$ at time $t_o$ and the level of the output signal from the A/D converter 13 is $X_o$. Under this condition, the analog signal z applied to the A/D converter 13 by way of the adder 12 is given $$z = 0.5x + 0.5X_o$$

A level range of the analog signal z is defined by $$(0.5X_o + 0.5X_o) \leq z < (0.5X_1 + 0.5X_o) \tag{1}$$

Arranging the formula (1), we have $$X_o \leq z < (X_o + 0.5\Delta X) < X_1$$

Accordingly, the A/D converter 13 produces a digital signal of $X_o$ as an initial value at time $t_o$ to be stabilized. When the level of the analog input signal x increases to fall within $X_1 \leq x < X_2$. At this time, the output signal z from the adder 12 has the level given by $$z = 0.5x + 0.5X_o$$

The level of the z falls within the following formula $$(0.5X_1 + 0.5X_o) < z < (0.5X_2 + 0.5X_o)$$

Namely, $$(X_o + 0.5\Delta X) \leq z < (X_o + \Delta X) = X_1 \tag{2}$$

Thus, it increases by the half of the minimum quantitizing accuracy $\Delta X$. The signal z, however, never exceeds the level $X_1$. As a result, the A/D converter 13 holds the digital output signal with the same level as the preceding level $X_o$. In other words, at the initial stage, even if the analog input signal x increases within a level range $X_o \leq x < X_2$, the digital converted output is kept at $X_o$.

When the analog input signal x enters the range of $X_2 \leq x < X_3$, the level range of the added output signal z is expressed by the following formula $$(X_o + \Delta X) \leq z < (X_o + 1.5\Delta X) \tag{3}$$

Namely, $$X_1 \leq z < (X_1 + 0.5\Delta X) < X_2 \tag{4}$$

The level of the converted output of the A/D converter 13 changes to $X_1$ ($= X_o + \Delta X$). With the level change, the positive feedback signal $\beta \cdot y$ changes to $0.5X_1$ and the added output signal z is $$z = 0.5x + 0.5X_1$$

That is, the level range of the signal z is expressed by $$X_1 < (X_1 + 0.5\Delta X) \leq z < (X_1 + \Delta X) = X_2 \tag{5}$$

Thus, the signal z discontinuously changes by $0.5\Delta X$. When the analog input signal x increases to enter a range defined by $X_3 \leq x < X_4$, the output level of the A/D converter 13 changes to $X_2$ ($= X_1 + \Delta X$). Following the change, the signal z again changes by $0.5\Delta X$ discontinuously, as in the above-mentioned way. Subsequently, the output level of the A/D converter 13 discretely changes by $\Delta X$ with the increase of the level of the analog input signal x, so that the added output signal z increases discretely at a step of $0.5\Delta X$. When the signal z changes within a range where the z shows no discrete change, the magnitude of a change of the added output signal z is the half of a change of the analog input signal. Accordingly, when the output level of the A/D converter has been $X_{i-1}$, the range of z is within $X_{i-1} \leq z < X_i$ even if the level range of the analog input signal x is within $X_{i-1} \leq x < X_{i+1}$, because in this case, the analog input signal x, the A/D converter output level $X_{i-1}$, and the added output signal z are related by $z = 0.5x + 0.5X_{i-1}$. Therefore, the signal z does not cross the $V_{th}$ line and the output signal from the A/D converter 13 is not changed. As a result, the level $X_{i-1}$ is kept.

When the input analog signal crosses the $V_{th}$ line of the $X_{i-1}$, the output of the A/D converter 13 changes to $X_{i-2}$, the added output signal z decreases by $\Delta X/2$ discontinuously. Also in this case, when the analog input signal x falls within $X_{i-2} < x < X_i$, the added output signal z falls within $X_{i-2} < z < X_{i-1}$ and hence the output of the A/D converter is stable at $X_{i-2}$.

To sum up, the added output signal z applied to the A/D converter 13 exhibits a continuous change of the half of the magnitude of a change of the analog input signal x, and also exhibits a discontinuous change of $0.5\Delta X$ every time that the added output signal z crosses the level determined by the threshold level set at the A/D converter 13. Additionally, when the analog input signal x increases, the discontinuous change is made in the increasing direction of the analog input signal. On the other hand, when it is decreased, the discontinuous change is in the decreasing direction. That is, in accordance with the analog input signal which changes by $\pm \Delta X$ with respect to the threshold level $X_i$ ($i=0, 1, 2, \ldots 2^N$) of the A/D converter 13, the added output signal z changes by $\pm \Delta X/2$ with respect to the intermediate value of the each $V_{th}$, that is, $(X_{i-1} + X_i)/2$, so that the signal z does not cross the $V_{th}$ line. For this reason, the digital signal obtained through the A/D converting operation of the added output signal z by the A/D converter 13, is stable. When the input signal changes exceeding the $\pm \Delta X$, the signal z crosses the $V_{th}$ line and the digital output signal changes by one step and the signal z changes discontinuously by $\Delta X/2$ through the positive feedback. Therefore, the A/D converter 13 has a non-sensitive band of $0.5\Delta X$ (in response to the command pulse, it produces a digital signal equal to that in the preceding converting operation). Therefore, if the analog input signal x minutely changes with respect to the threshold level $X_i$ set at the A/D converter, there never happens, unlike the conventional case, that the LSB (least significant bit) of the output signal from the A/D converter 13 is inverted or changed and hence granular noise is produced in the digital output. As a result, the digital output signal $Y_1$ with little variation of the LSB as shown in FIG. 4 is obtained (compare it with the circuit shown in FIG. 2). The added output signal z always corresponds to the analog input signal x. Therefore, it is evident that the output signal $Y_1$ of the A/D converter 13 corresponds to the analog input signal x. With respect to the signal level, the output signal $Y_1$ may be considered to be equal to that of the output y of the D/A converter 15. Therefore, the signal $Y_1$ is depicted corresponding to the signal x in FIG. 4. This is correspondingly applicable for the subsequent drawings. The z is expressed as a mean value of the signal x and the signal $Y_1$.

Figure 5:
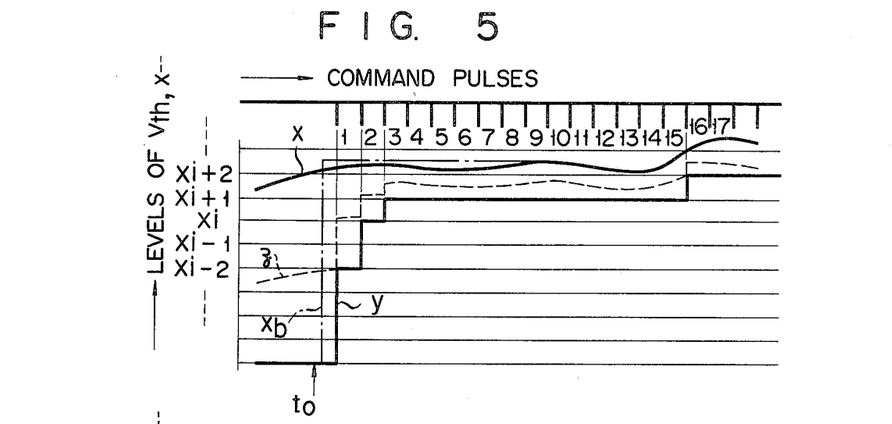

In the case of FIG. 4, the analog input signal x and the output signal $Y_1$ of the A/D converter 13 are close to each other at the initial time $t_o$. However, even when the input signal x and the digital output signal $Y_1$ are substantially dislocated from each other at the initial time $t_o$ by approximately 10 quantitizing steps, the converter system of the present invention has still the function to stabilize the output signal. As shown in FIG. 5, when command pulses are applied to the A/D converter 13 to drive the A/D converter 13, the added output signal z has a substantially averaged level, as indicated by a dotted line, of the analog input signal x and the output signal y of the D/A converter 15. For this reason, the output level of the A/D converter 13 is greatly stepped up. Regardless of such a great step-up of the output level of the A/D converter 13, the level of the output signal of the A/D converter 13 does not reach the level of the analog input signal x. See the command pulse 1. If the command pulses are successively applied to the A/D converter 13, the output level $Y_1$ of the A/D converter 13 stepwise increases and finally, for example, at the command pulse 3, the output level of the A/D converter 13 converges at a stable point corresponding to the analog input signal x. Thus, if the level of the signal x and the output level $Y_1$ of the A/D converter 13 are greatly different from each other at the initial stage, a stable digital output may be secured by the converging action. As shown in FIG. 5, even when the analog input signal is the analog input signal $x_b$ as indicated by a one-dot chain line, the same converge action may be expected. The converging rate depends on a level difference between the signals x and $Y_1$ at the initial stage. For example, when $\beta = 0.5$, four times of the converting operations makes the convergence for approximately 10 quantitizing steps of the level difference. About eight times of the converting operations make the convergence for 256 quantizing steps of the level difference.

Figure 6:
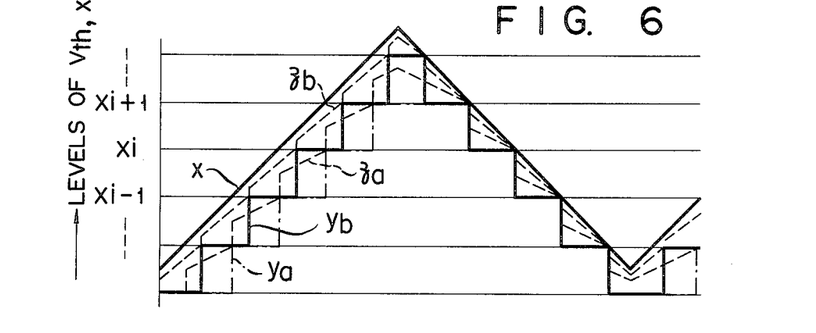
Figure 7:
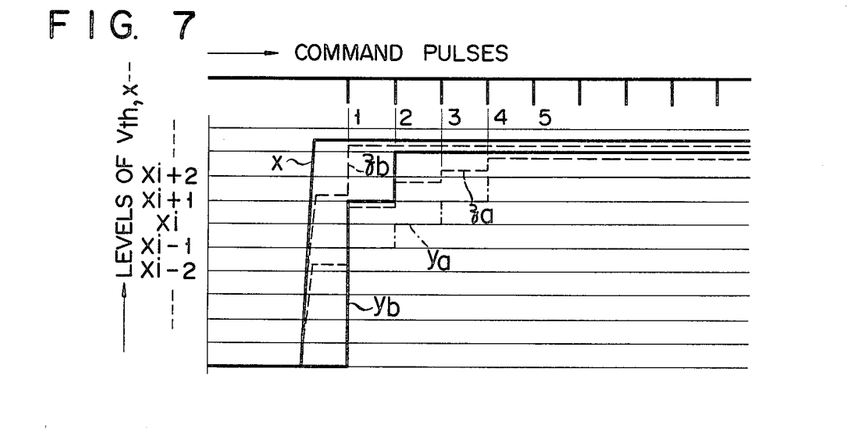

FIGS. 6 and 7 graphically illustrate how a response characteristic of the A/D converter system changes when the input coefficient $\alpha$ and the feedback coefficient $\beta$ are changed. In FIG. 6, the analog input signal x is a triangle waveform. $z_a$ is an output signal of the adder 12 when $\beta = 0.5$. $z_b$ is an output signal of the adder 12 when $\beta = 0.2$, $y_a$ is an output signal from the D/A converter 15 when $\beta = 0.5$. $y_b$ is an output signal of the D/A converter 15 when $\beta = 0.2$. In this case, $\alpha = 1 - \beta$. In FIG. 7, x is an analog stepped input signal and $z_a$, $z_b$, $y_a$ and $y_b$ are similar to those of FIG. 6. As seen from FIGS. 6 and 7, as the feedback coefficient $\beta$ is smaller, the output level of the A/D converter 13 well follows a change of the analog input signal x and the converging rate of the output level is high and the distortion of the waveform of the output signal from the A/D converter is also small. In other words, the rise characteristic of the A/D converter 13 is good.

When the analog input signal x crosses in one direction one threshold level, for example, $X_i$, set in the A/D converter 13, and crosses again the same in the reverse direction to return to the original level, the dead zone of the A/D converter 13 is $\beta \Delta X$ and the magnitude of the dead zone of the A/D converter system is $(\beta/\alpha) \cdot \Delta X$. The dead zone of the A/D converter system till the analog input signal x exceeds the next threshold level is $\{(1-\beta)/\alpha\} \cdot \Delta X$. When the feedback coefficient $\beta$ is 0.5, the width of the dead zone of the A/D converter system at one side is equal to that ranging at the other side of one threshold level. The width of the dead zone of each side is $(0.5/\alpha) \cdot \Delta X$.

The example of FIG. 4 has been described on the assumption that $\alpha = \beta = 0.5$. The input coefficient $\alpha$ may take any value, since it is a converting coefficient to determine the gain between the input and output of the A/D converter. However, if $\alpha$ and $\beta$ are so selected to have a relation $\alpha = 1 - \beta$, the gain between the input and output of the A/D converter system may be made equal to that of the single A/D converter 13.

As described above, the present invention may determine the dead zone of the A/D converter for a minute change of the analog input signal. For this reason, even if the analog input signal minutely changes in level due to the overlapped noise signal, no granular noise is contained in the output signal of the A/D converter 13.

Further, the positive feedback loop may be constructed readily, the A/D converter system according to the invention may easily be realized.

Figure 8:
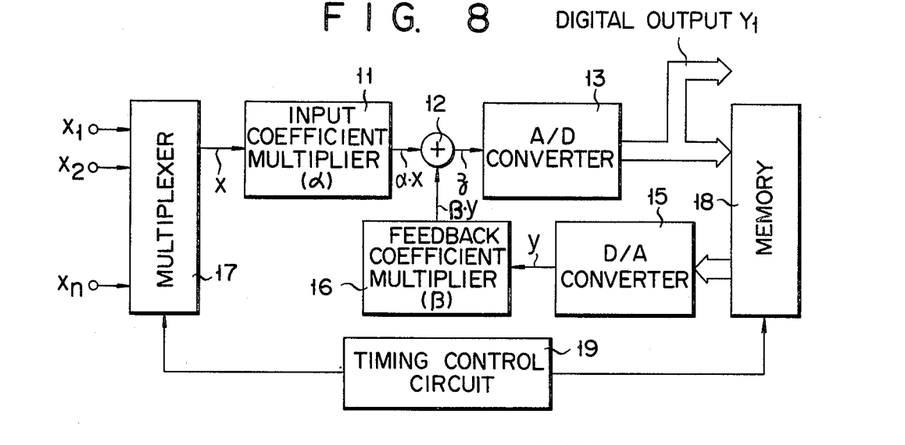
FIG. 8 is a block diagram of a second embodiment of the A/D converter system according to the invention.

In FIG. 8 illustrating the second embodiment of the present invention, a plurality of analog input signals are successively converted into digital signals by the single A/D converter in a time-division manner. In FIG. 8, analog input signals $x_1, x_2, \ldots, x_n$ are successively or selectively inputted into the input coefficient multiplier 11, through a multiplexer 17. The output signal from the input coefficient multiplier 11 passes through an adder 12 to an A/D converter 13 where those are subjected to analog to digital conversion. The digital signal $Y_1$ A/D converted is loaded into the memory locations of the memory 18 with the addresses corresponding to the input signals $x_1, x_2, \ldots, x_n$. The timing control circuit 19 interlocks the multiplexer 17 with the memory 18 in the read and write operations. When a control circuit 19 specifies the operation of the multiplexer for the analog input signal $x_1$, for example, the output signal from the A/D converter corresponding to the $x_1$ in the preceding converting operation is read out from the corresponding address of the memory 18 and is applied to the D/A converter 15. The output signal from the D/A converter 15 is multiplied by the coefficient $\beta$ in the feedback coefficient multiplier 16. The multiplied one is applied to the adder 12 where it is added to the output $\alpha \cdot x$ of the input coefficient multiplier corresponding to the input $x_1$. The output signal z is A/D converted by the A/D converter 13. Those operations are exactly the same as those in the embodiment shown in FIG. 3. The operation for those input signals $x_2, \ldots, x_n$ are the same as the operation for the input signal $x_1$.

Figure 9:
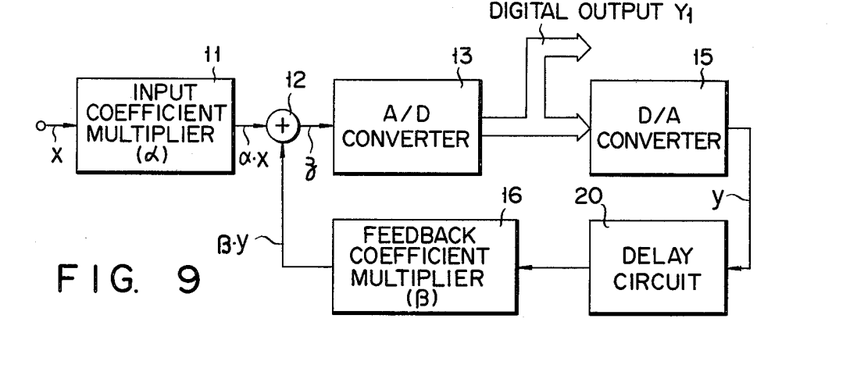
FIG. 9 is a block diagram of a third embodiment of the A/D converter system according to the invention.

In the embodiments shown in FIGS. 3 and 8, the output signal from the A/D converter 13 is stored and, after one converting operation period of the A/D converter 13, the stored data is read out and the data read out is used for the next A/D converting operation. In the third embodiment shown in FIG. 9, the output signal of the A/D converter 13 is directly D/A converted by the D/A converter 15. The output signal y of the D/A converter 15 is delayed by the delay circuit 20 by at least one converting operation period of the A/D converter 13. The delayed signal is applied to an adder 12 through a feedback coefficient multiplier 16.

Figure 10:
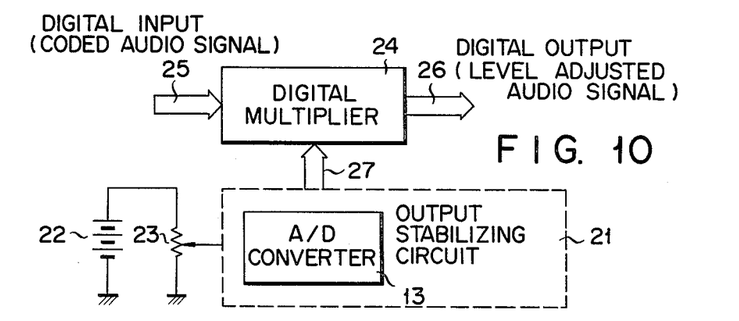
FIG. 10 is a block diagram for illustrating an application of the A/D converter system according to the invention.

FIG. 10 shows a block diagram of a level adjuster to which the present invention is applied. For example, a coded audio signal 25 is multiplied by a control digital signal 27 of a given number of bits in a digital multiplier 24. The multiplied one is produced as a level-adjusted digital audio signal 26. The digital signal 27 of the A/D converter system according to the present invention including a DC power source 22, a voltage dividing resistor 23, an A/D converter 13, and an output stabilizing circuit 21, is outputted as a digital output signal corresponding to an analog voltage divided by the voltage dividing resistor 23 and is multiplied by the digital input signal 25 in the digital multiplier 24. Assume now that the digital input signal 25 is expressed by 12 to 16 bits. When the multiplication is performed by the multiplier 24, holding a given number of significant digits, the control signal 27 also needs 12 to 16 bits. When the control signal is instable, there is a danger that the output signal 26 may lost the information defined by the several lower bits of the input signal 25. If the digital output signal 27 of the converter system according to the present invention is applied as a control signal to the multiplier 24, it is possible to make the level adjustment of the digital input 25 while the given number of significant digits are held, even if about 8 bits are used for the control signal 27. The reason for this is that even if there is included a noise component caused by the instability of the power source 22 and the resistor 23, the control signal 27 is stable.

As previously stated, the embodiment shown in FIG. 3 may produce a stable digital output signal regardless of the existence of a minute variation of the analog input signal x or a superposed noise. The present embodiment has the following two disadvantages. First, when the analog input signal x has a stepped waveform, the response of the A/D converter system retards in the vicinity of the stepped portion of the waveform. Second, as mentioned above in an example case of that the analog input signal x is a triangular waveform, the waveform of the digital output signal is distorted from that of the analog input signal. The response retardation and the distortion of the waveform may be solved by an embodiment to be described later.

Figure 11:
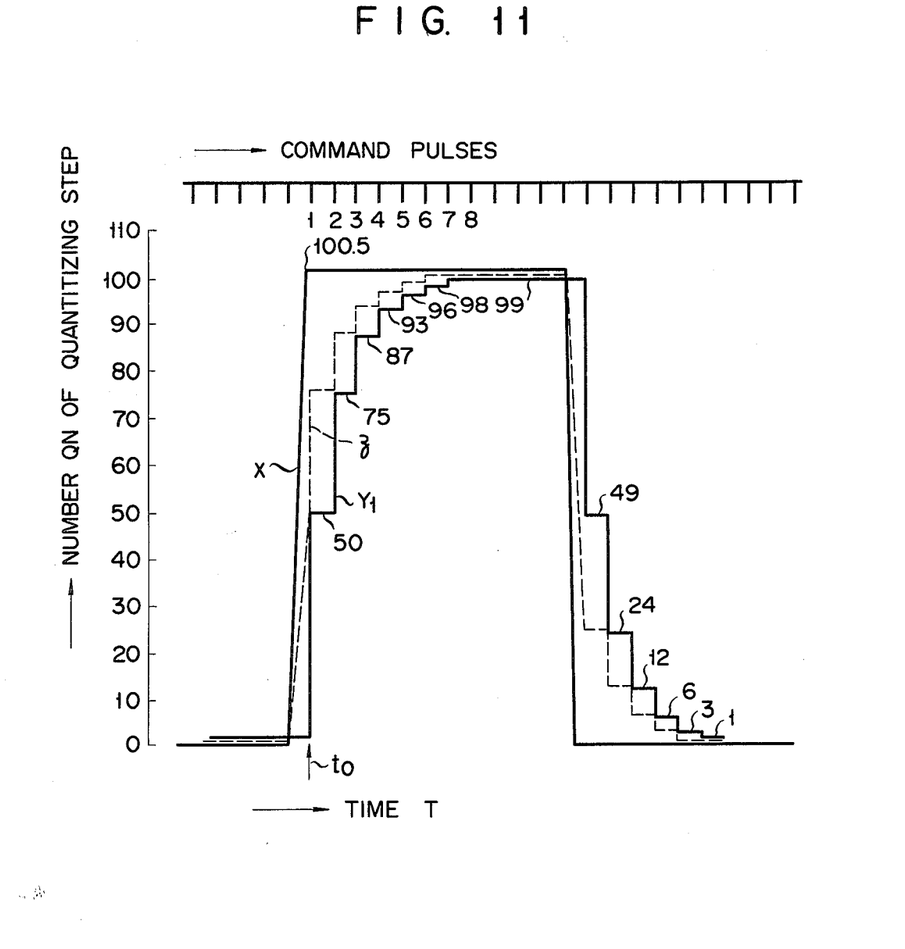
FIG. 11 and FIGS. 12A to 12C show graphical representations of a response characteristic of an A/D converter system for an analog input signal when the system shown in FIG. 3 is used.

The following discussion deals with an analysis of a response delay of the A/D converter system shown in FIG. 3 for a stepped analog input signal x, on the assumption that the input coefficient $\alpha$ and the feedback coefficient $\beta$ are each 0.5. Reference is made to FIG. 11 of which the ordinate represents the quantitizing step number QN and the abscissa, time T. x, z and $Y_1$ indicate respectively the same quantities as those in FIG. 3. For ease of explanation, the output signal $Y_1$ of the A/D converter 13 rises at the timing of the command pulse 1. When the A/D converter 13 operates in response to the command pulse 1, the output signal of level $Y_1$ is obtained from the A/D converter 13. At the initial time $t_o$, the added output signal z has an about average value of the analog input signal x (step 100.5) and the output signal y of the D/A converter 15, so that the signal $Y_1$ rises to the step 50. However, the signal $Y_1$ does not reach the level corresponding to the signal x. In other words, the response to the A/D converter system is delayed with respect to the input signal x. With application of the successive command pulses, the output level of the A/D converter 13 successively changes in the order of steps (QN) 75, 87, 93, .... Finally, that is, when the command pulse 7, for example, is applied, the signal level $Y_1$ steps up to QN=99 and converges to a stable point (QN=99). In this example, when the analog input signal x corresponds to 100 quantitizing steps, the signal level $Y_1$ does not converge to the x until the A/D converting operations are repeated seven times. When the step of the x corresponds to 256 quantitizing steps, the A/D converting operations must be repeated eight times till the $Y_1$ converges to the x.

Figure 12A:
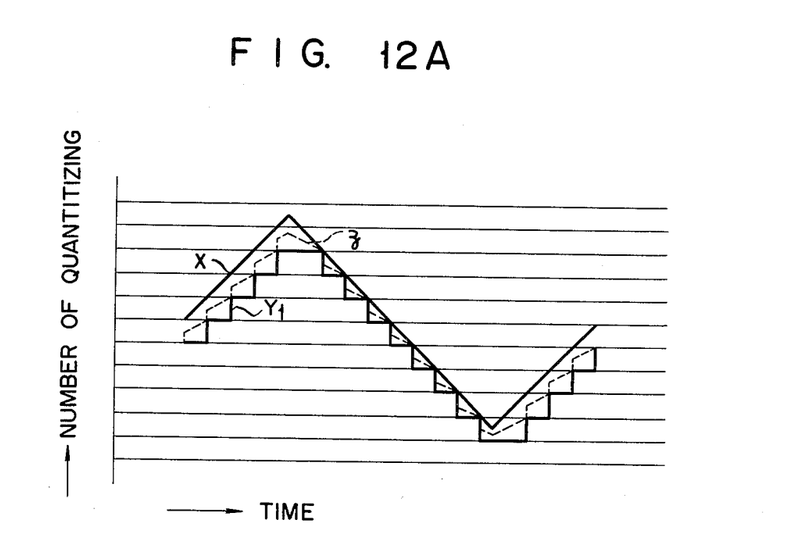
Figure 12B:
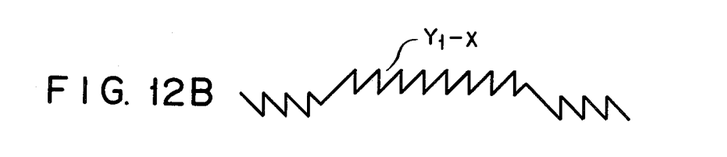
Figure 12C:
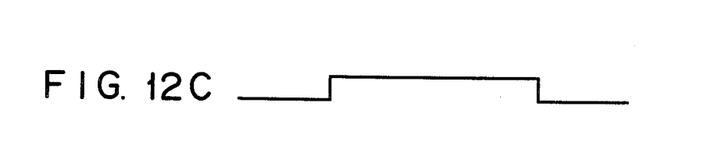

Let us analyze the matter of the waveform distortion, referring to FIG. 12A. In FIG. 12A, the ordinate represents the quantitizing number (numerals representing the number of it are not illustrated) and the abscissa represents time. x, z and $Y_1$ are the same quantities as those in FIG. 11. The A/D converter 13 has a hysteresis characteristic in the A/D converting operation because it A/D-converts the mean value of the added output signal z, or the analog input signal x, and the output signal y of the D/A converter. It is for this reason that the waveform $Y_1$ is distorted. The hysteresis characteristic is caused by the different A/D converting operations for the increase and decrease of the x, as shown in the figure. FIG. 12C shows a waveform of the distortion component of the $Y_1$ and FIG. 12B shows a waveform when the quantitizing noise is superposed on the waveform of the distortion component shown in FIG. 12C.

Figure 13:
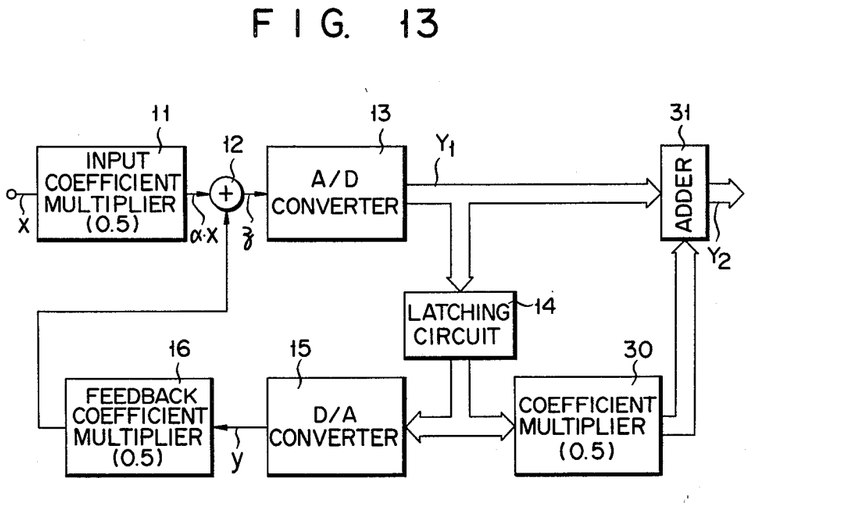
FIG. 13 is a block diagram of a fourth embodiment of the A/D converter system according to the invention.
Figure 14A:
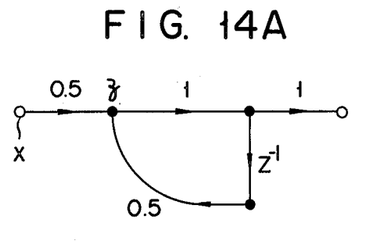
FIGS. 14A and 14B are signal flow charts of a signal to be basically considered in the embodiment shown in FIG. 13.

The response delay and the waveform distortion may be improved by using a fourth embodiment shown in FIG. 13. Before entering the embodiment shown in FIG. 13, two signal flow diagrams will be given referring to FIGS. 14A and 14B. In the figures, a black dot "●" and a white dot "○" denote nodes, respectively, and the numbers attached to the nodes indicate node values. A line segment with an arrow between the adjacent nodes indicates a branch. A numeral attached to the branch is a transfer function of the branch. Assume now that, in the embodiment shown in FIG. 3, $\alpha=\beta=0.5$ and no quantitizing is made in the A/D converter 13. In this case, the circuit shown in FIG. 3 constitutes a recursive filter as shown in FIG. 14A. In the figure, a transfer function between the input terminal of x and the adder 12, is 0.5. The transfer function between the adder 12 and the D/A converter is 1. $Z^{-1}$ is representative of a delay operator to delay the signal z by one sampling period. The delayed signal is fed back to the adder 12, with 0.5 of the transfer function. Here, $Z = \exp(j2\pi f)$ where f is a sampling frequency. Hence, the transfer function [H(z)] of the circuit shown in FIG. 14A is expressed by $$H(z) = 0.5/(1 - 0.5Z^{-1})$$

Figure 14B:
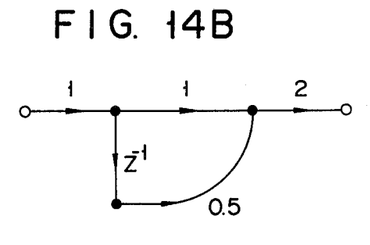

If the signal flow diagram as shown in FIG. 14B is constructed, the circuit of FIG. 14B has an inverse transfer function $G(z) = (1 - 0.5Z^{-1})/0.5$ of that of FIG. 14A. If the circuits shown in FIGS. 14A and 14B are connected in series, the transfer function of the series circuit is $H(z) \cdot G(z) = 1$. Therefore, the response delay and the distortion of the output waveform described before may be improved.

Figure 15:
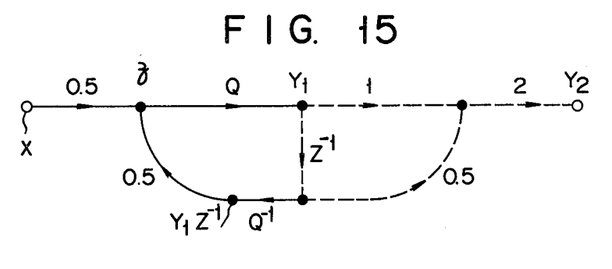
FIG. 15 is a signal flow chart of the signal in the FIG. 13 embodiment.

FIG. 13 shows a fourth embodiment of the present invention to which the signal flow diagrams shown in FIGS. 14A and 14B are applicable. FIG. 15 is a flow diagram of a signal in the circuit shown in FIG. 13. In FIG. 15, a continuous line designates a flow of an analog signal and a broken line, a flow of a digital signal. A numeral attached to an arrow of a branch represents a transfer function of the corresponding branch. Q represents a quantitizing operation, or the A/D conversion, and $Q^{-1}$ designates an inverse quantitizing operator, or the D/A conversion. $Z^{-1}$ represents a delay operator of one sampling period of the output $Y_1$, as described referring to FIGS. 14A and 14B. Z is exp $(j2\pi f)$ where f is a sampling frequency. When no quantitizing operation is made, that is, $Q = Q^{-1} = 1$, the flow diagram of FIG. 15 is equivalent to the cascade connection of the circuits FIGS. 14A and 14B with $Z^{-1}$ used commonly for them, and the transfer function of the FIG. 15 is 1. In fact, however, $Q \neq 1$ and $Q^{-1} \neq 1$ (the transfer function is not 1), so that the transfer function of FIG. 15 is not 1 and producing an error.

In FIG. 13, an arrangement of the input coefficient multiplier 11, the adder 12, the A/D converter 13, the latching circuit 14, the D/A converter 15 and the feedback coefficient multiplier 16 are the same as that shown in FIG. 3. Therefore, the explanation of them will be omitted here. In this example, the input coefficient $\alpha$ of the multiplier 11 and the feedback coefficient $\beta$ of the multiplier 16 are selected to be 0.5. The fourth embodiment further includes an adder 31 and a coefficient multiplier 30. The coefficient multiplier 30 produces an output signal which is the production of the output signal of the latching circuit 14 and the coefficient 0.5.

The adder 31 adds the output signal $Y_1$ of the A/D converter 13 and the output signal from the multiplier 30 and produces a digital signal $Y_2$.

Figure 16:
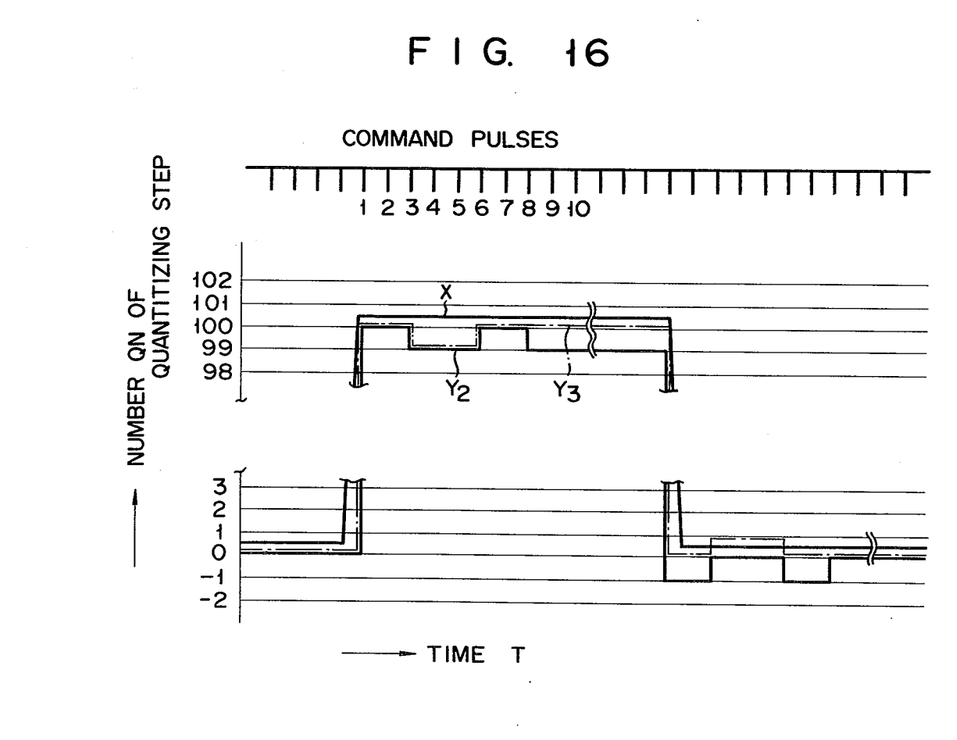
FIG. 16 and FIGS. 17A and 17B are waveforms for illustrating response characteristic of the A/D converter system shown in FIG. 13 for the analog input signal.

FIG. 16 is a response characteristic when the analog input signal x shown in FIG. 11 is A/D-converted by using the A/D converter system shown in FIG. 13. In FIG. 16, the output $Y_2$ at a first command pulse 1 steeply rises corresponding to the rise of the signal x. There is observed a vibration of a magnitude of one quantitizing step in the output signal $Y_2$ during a period from the command pulses 1 to 8. The vibration is caused due to the quantitizing error, that is, when $Q \neq 1$ and $Q^{-1} \neq 1$, as previously stated. It was found that the construction shown in FIG. 13 of the A/D converter system remarkably improves the response to the stepwise changing analog input signal. The output $Y_3$ of the FIG. 16 will be described later.

Figure 17A:
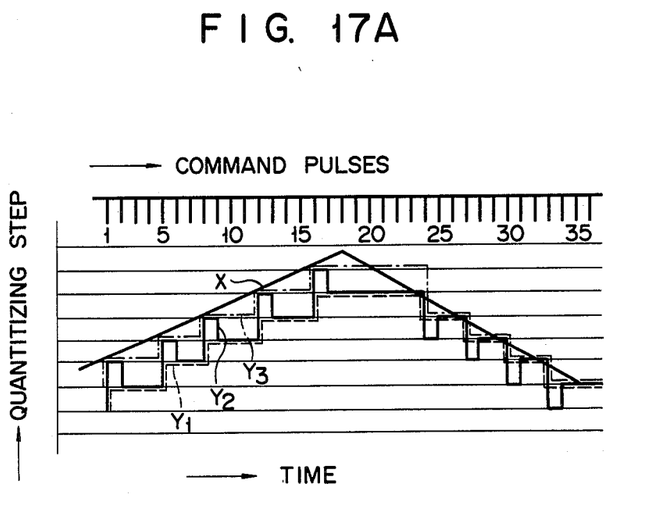
Figure 17B:
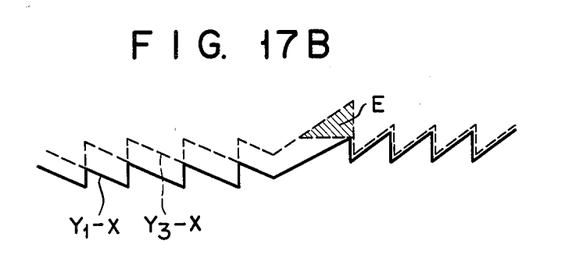

The explanation to follow referring to FIGS. 17A and 17B is the elaboration of the response of the system shown in FIG. 13 for the analog input signal x, that is, a triangle wave x with the same waveform shown in FIG. 12A. In the figure, $Y_1$ is an output signal for the A/D converter 13 shown in FIG. 13 and $Y_2$ an output signal from the adder 31 shown in FIG. 13. $Y_3$ will be described later. When the x changes in the increasing direction, the $Y_2$ at the time point of the command pulse 5 exhibits a correct value. At the time point of the next command pulse 6, the $Y_2$ has a value lower by one quantitizing step than the correct one. On the hand, when the signal x is changed in the decreasing direction, the signal $Y_2$ decreases by two quantitizing steps at the time point of the command pulse 24, and it increases by one quantitizing step at the time point of the next command pulse 25. The value of the signal $Y_2$ at the time point of the command pulse 25 is correct. As seen from FIG. 17A, the $Y_2$ shows a more correct response to the analog input signal than the $Y_1$.

Figure 18A:
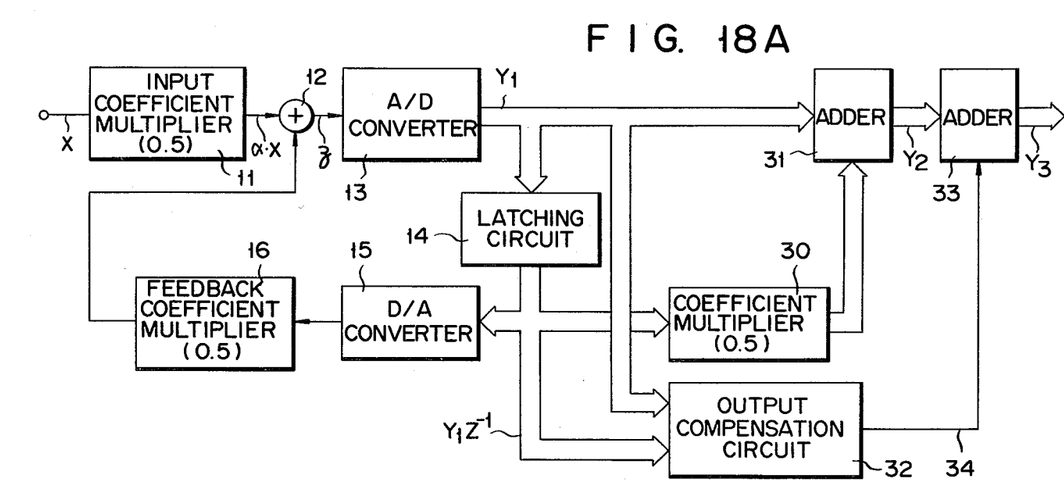
FIG. 18A shows a block diagram of a fifth embodiment of the A/D converter system according to the invention.
Figure 18B:
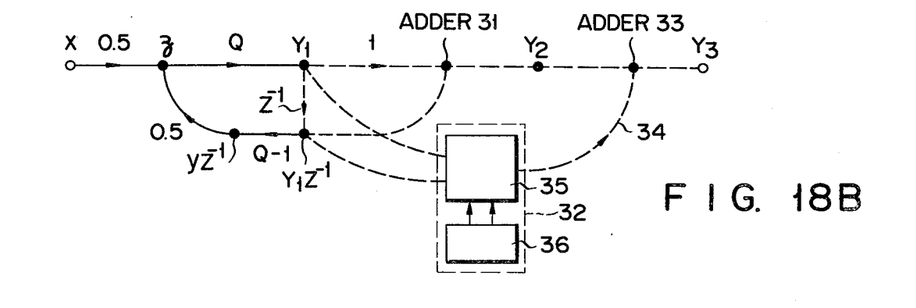
FIG. 18B is a signal flow chart of a signal in the embodiment shown in FIG. 18A.

FIG. 18A is a block diagram of a fifth embodiment of the present invention. In FIG. 18B, there is shown a signal flow chart or diagram of a signal in the system shown in FIG. 18A. The system shown in FIG. 18A is provided with an output compensation circuit 32 and an adder 33, in addition to the circuit components shown in FIG. 13. The output compensation circuit 32 receives the output $Y_1$ from the A/D converter 13 and the output $Y_1 Z^{-1}$ from the latching circuit 14, and produces a compensating signal onto a line 34. The adder 33 adds the compensation bit 34 to the output $Y_2$ of the adder 31, and produces a digital output signal $Y_3$ as the output signal from the A/D converter system. The present embodiment improves the defect of the output signal $Y_2$ of FIG. 17A, that is, a fluctuation of the quantitizing step that the $Y_2$ shows a correct value at the command pulse 5, its value is decreased by one quantitizing step at the command pulse 6, by two quantitizing steps at the command pulse 24, and increased by one quantitizing step to show again its correct value. The just-mentioned disadvantages may be overcome by adding a value, i.e. 1 bit, corresponding to one quantitizing step to the output $Y_2$ in the adder 33.

Figure 19:
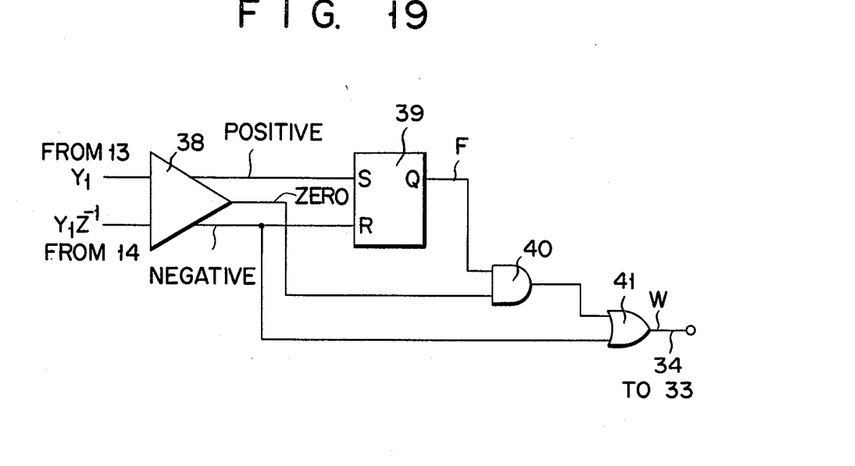
FIG. 19 is a circuit diagram of an output compensation circuit used in the circuit in FIG. 18A.

An example of a compensation circuit is shown in FIG. 19. In FIG. 19, the comparator 38 receives the output $Y_1$ of the A/D converter 13 and the output $(Y_1 Z^{-1})$ which corresponds to the $Y_1$ delayed by at least one converting operation of the A/D converter 13. When $(Y_1 - Y_1 Z^{-1}) > 0$, that is, when the signal x rises, the comparator 38 renders a line "POSITIVE"

"1". When $Y_1-Y_1Z^{-1}=0$, that is, when the signal x remains unchanged, it renders a line "ZERO" "1". When $(Y_1-Y_1Z^{-1})<0$, it renders a line "NEGATIVE" "1". A flag register 39 is supplied at the set terminal S with the POSITIVE signal, and at the reset terminal R with a NEGATIVE signal. When it is set, the output F at the Q terminal is "1". When it is reset, the output F is "0". Applied to an AND circuit 40 are the output F and the ZERO output signal from the comparator 38. Applied to an OR circuit 41 are the output signal from the AND gate 40 and the NEGATIVE output signal from the comparator 38. The output signal W of the OR circuit 41 is applied to an adder circuit 33. The above-mentioned operations are tabulated as below.

| CONDITION | POS. | ZER. | NEG. | F | W |
|---|---|---|---|---|---|
| $Y_1 > Y_1Z^{-1}$ | 1 | 0 | 0 | 1 | 0 |
| $Y_1 = Y_1Z^{-1}$ | 0 | 1 | 0 | Q | W = Q |
| $Y_1 < Y_1Z^{-1}$ | 0 | 0 | 1 | 0 | 1 |

In the above truth table, Q is a value held by the flag register 39 before the output condition of the comparator 38 changes. The output W is expressed by $$W = (NEG. + ZER. \times F) \times \overline{POS.}$$

As seen from the above truth table, there never occurs a case that two or more of POS., ZER. and NEG. are concurrently "1". Therefore, the output W is given $$W = NEG. + ZER. \times F$$

More specifically, in FIG. 17A, when the analog signal x rises (the output of the comparator 38 is POSITIVE), the adder 33 adds "0" to the output $Y_2$. When the signal x decreased (the output of the comparator 38 is NEGATIVE), the adder adds "1" to the output $Y_2$. When the output of the comparator 38 is ZERO and the output of the comparator 38 was POSITIVE before it is ZERO, "1" is added to $Y_2$. Under the same condition, when it was NEGATIVE, "0" is added to the same. Accordingly, in FIGS. 16 and 17A, the output $Y_3$ of the adder 33 is depicted as indicated by a one-dot chain line. When the analog input signal x is a triangle wave signal, the quantitizing noise and distortion is as indicated by $Y_3-x$ in FIG. 17B and a portion denoted as E has an error. However, it is noted that the distortion is remarkably reduced, compared to that of the embodiment shown in FIG. 3 as indicated by $Y_1-x$ in FIG. 17B.

Figure 20:
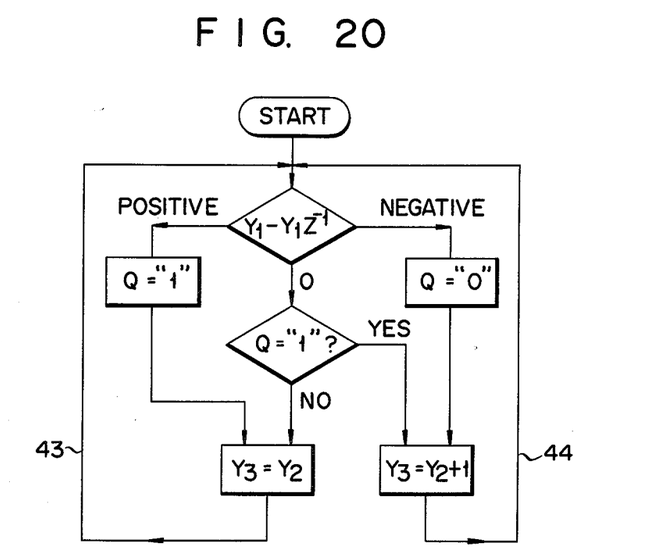
FIG. 20 is a flow chart which is useful in explaining an output compensating process of the compensation circuit shown in FIG. 18.

FIG. 20 shows a flow chart for illustrating the operation of the compensation circuit 32. In FIG. 20, "START" indicates the start of the operation of the A/D converter system (FIG. 18A). A line 43 indicates that the output $Y_3$ of the adder 33 is produced as the $Y_2$. A line 44 indicates that the output $Y_3$ of the adder 33 is produced as the sum of "1" and the $Y_2$.

In the embodiments shown in FIGS. 15 and 18B, the delay operator $Z^{-1}$ is commonly used in both FIGS. 14A and 14B. Alternatively, a memory and a transmission circuit, for example may be inserted between the circuits corresponding to FIGS. 14A and 14B. The full scale $X_{FS}$ of the A/D converter, that is, the maximum allowable input level, the number N of the converting bits, the converting code may be properly selected as required. The input coefficient $\alpha$ defines a converting coefficient between the analog input signal x and the digital converted output, so that it may be set properly in FIGS. 3, 8 and 9. The feedback coefficient $\beta$ defines the width of the dead zone of the A/D converter 13 and also changes the response to the digital input signal x. In case where the response is regarded as important, $\beta$ is set to 0.1. To cope with noise problem, it is set to a large value, for example, 0.7. It is evident that a sample hold circuit may be provided at the input stage of the A/D converter 13.

What we claim is:

1. An A/D converter system with an output stabilizing circuit comprising:
   an adder for summing an analog input signal and a positive feedback signal;
   an A/D converter for converting the output signal from said adder into a digital signal;
   a D/A converter means for producing an analog feedback signal corresponding to the output signal from said A/D converter after at least one converting operation period of said A/D converter, said D/A converter means including a D/A converter and a signal delay means; and
   a feedback coefficient multiplier for producing said positive feedback signal obtained by multiplying a given feedback coefficient valued at less than 1 by said analog feedback signal and an input coefficient multiplier which multiplies a first analog input signal by a given input coefficient and produces said first analog input signal as a second analog input signal to be supplied to said adder, and the sum of said input coefficient and said given feedback coefficient is 1.

2. An A/D converter system according to claim 1, wherein said signal delay means delays the output signal from said A/D converter and applies the delayed signal to said D/A converter.

3. An A/D converter system according to claim 1, wherein said delay means delays an analog signal obtained by converting the output signal from said A/D converter by said D/A converter.

4. An A/D converter system according to claim 1, further comprising:
   a multiplexer for applying a signal selected from a plurality of analog signals as said analog input signal to said adder;
   a memory with a plurality of addresses determined corresponding to the output signals from said multiplexer, which temporarily stores the output signal from said A/D converter corresponding to said selected analog signal in a corresponding address, and applies to said D/A converter the data temporarily stored after at least one converting operation of said A/D converter; and
   a timing control circuit coupled with said multiplexer and said memory to control a supplying timing of the analog input signal to said adder and the read timing of the data temporarily stored in said memory.

5. An A/D converter system with an output stabilizing circuit comprising:
   a first adder for adding an analog input signal and a positive feedback signal;
   an analog to digital (A/D) converter for converting the output signal of said first adder into a digital signal;
   a delay means for delaying the output signal of said A/D converter by one sampling period of said analog input signal;

a digital to analog (D/A) converter for converting the output signal from said delay means into an analog feedback signal;

a first coefficient multiplier for multiplying said analog feedback signal by a feedback coefficient 0.5 thereby to form said positive feedback signal;

a second coefficient multiplier for producing an output signal which is the product of the output signal from said delay means and the coefficient 0.5; and a second adder which adds the output signal of said A/D converter and the output signal of said second coefficient multiplier thereby to produce an output signal of the A/D converter system.

6. An A/D converter system according to claim 5, further comprising a third coefficient multiplier for supplying a second analog input signal formed by multiplying a first input analog signal by the input coefficient 0.5, as said analog signal to said first adder.

7. An A/D converter system with an output stabilizing circuit comprising:

a first adder for adding an analog input signal and a positive feedback signal;

an analog to digital (A/D) converter for converting the output signal of said first adder into a digital signal;

delay means for delaying the output signal of said A/D converter by one sampling period of said analog input signal;

a digital to analog (D/A) converter for converting the output signal from said delay means into an analog feedback signal;

a first coefficient multiplier for multiplying said analog feedback signal by a feedback coefficient 0.5 thereby to form said positive feedback signal;

a second coefficient multiplier for producing an output signal which is the product of the output signal from said delay means and the coefficient 0.5;

a second adder which adds the output signal of said A/D converter and the output signal of said second coefficient multiplier;

a compensating circuit for compensating an output signal of said second adder; and a third adder for adding the output signal from said compensating circuit to the output signal of said second adder thereby to produce an output signal of the A/D converter system, wherein said compensating circuit includes (i) a comparing circuit which receives the output signal from said A/D converter as a first input and the output signal of said delay means as a second input, and produces a POSITIVE output signal when said first input signal is larger than said second input signal, produces a NEGATIVE signal when the former is smaller than the latter, and produces a ZERO signal when both input signals are equal to each other, and (ii) a logic circuit including a flag register for temporarily storing the POSITIVE or NEGATIVE output signal, which logic circuit, coupled with said comparator, produces "0" when the output of said comparing circuit is POSITIVE, produces "1" when it is NEGATIVE, produces "1" when it is ZERO and said flag register is stored with said POSITIVE value, and produces "0" when it is ZERO and said flag register is stored with a NEGATIVE value, and applies it as an addition signal to said third adder.

8. An A/D converter system according to claim 7, in which the POSITIVE output of said comparator is applied to the set terminal of the flag register of said logic circuit and the NEGATIVE output signal is applied to the reset terminal, and said logic circuit further includes an AND circuit for receiving the output signal of said flag register and the ZERO output from said comparing circuit, and an OR circuit which receives the output of said AND circuit and the NEGATIVE output of said comparator circuit, and applies an output signal to said third adder.

* * * * *